(12) United States Patent
Soga et al.

(10) Patent No.: US 8,125,090 B2
(45) Date of Patent: Feb. 28, 2012

(54) SEMICONDUCTOR POWER MODULE

(75) Inventors: Tasao Soga, Hitachi (JP); Daisuke Kawase, Mito (JP); Kazuhiro Suzuki, Mito (JP); Eiichi Morisaki, Kasama (JP); Katsuaki Saito, Iwaki (JP); Hanae Shimokawa, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/843,934

(22) Filed: Jul. 27, 2010

(65) Prior Publication Data

US 2010/0289148 A1   Nov. 18, 2010

Related U.S. Application Data

(63) Continuation of application No. 11/739,122, filed on Apr. 24, 2007, now Pat. No. 8,004,075.

(30) Foreign Application Priority Data

Apr. 25, 2006 (JP) .................................. 2006-120028
Jun. 9, 2006 (JP) .................................. 2006-160421

(51) Int. Cl.
*H01L 23/48* (2006.01)
*H01L 23/52* (2006.01)
*H01L 29/40* (2006.01)

(52) U.S. Cl. .. 257/779; 257/781; 257/789; 257/E23.021

(58) Field of Classification Search .................. 257/687, 257/787, 788, 789, 790, 795, E23.116, E23.128, 257/779, 780, 781, E23.021
See application file for complete search history.

(56) References Cited

U.S. PATENT DOCUMENTS

| | | | |
|---|---|---|---|
| 5,520,752 | A | 5/1996 | Lucey, Jr. et al. |
| 6,700,209 | B1 | 3/2004 | Raiser et al. |
| 7,123,466 | B2 | 10/2006 | He et al. |
| 7,262,491 | B2 | 8/2007 | Islam et al. |
| 2004/0102023 | A1 | 5/2004 | Morozumi et al. |
| 2005/0040519 | A1 | 2/2005 | Huang et al. |
| 2005/0167821 | A1 | 8/2005 | Mamitsu et al. |
| 2008/0261001 | A1 | 10/2008 | Nakatsuka et al. |

FOREIGN PATENT DOCUMENTS

| | | |
|---|---|---|
| JP | 10-107086 | 4/1998 |
| JP | 10-135377 | 5/1998 |
| JP | 2004-165281 | 6/2004 |
| JP | 2004-228286 | 8/2004 |

*Primary Examiner* — Hoai V Pham
(74) *Attorney, Agent, or Firm* — Antonelli, Terry, Stout & Kraus, LLP.

(57) ABSTRACT

Use of Pb-free solder has become essential due to the environmental problem. A power module is formed by soldering substrates with large areas. It is known that in Sn-3Ag-0.5Cu which hardly creeps and deforms with respect to large deformation followed by warpage of the substrate, life is significantly shortened with respect to the temperature cycle test, and the conventional module structure is in the situation having difficulty in securing high reliability. Thus, the present invention has an object to select compositions from which increase in life can be expected at a low strain rate. In Sn solder, by doping In by 3 to 7% and Ag by 2 to 4.5%, the effect of delaying crack development at a low strain rate is found out, and as a representative composition stable at a high temperature, Sn-3Ag-0.5Cu-5In is selected. Further, for enhancement of reliability, a method for partially coating a solder end portion with a resin is shown.

13 Claims, 8 Drawing Sheets

SEMICONDUCTOR POWER MODULE

CROSS-REFERENCE TO RELATED APPLICATIONS

This application is a continuation application of U.S. application Ser. No. 11/739,122, filed Apr. 24, 2007 now U.S. Pat. No. 8,004,075, the entire contents of which is hereby incorporated by reference into this application.

BACKGROUND OF THE INVENTION

The present invention relates to a semiconductor power module, and more particularly, to a semiconductor power module having a base substrate, a ceramic insulating substrate, and a semiconductor chip which are connected with solder.

Generally, a semiconductor power module is configured so that an Si chip, an insulating substrate of AlN, $Al_2O_3$ or the like, a Cu base substrate or the like excellent in thermal conductivity are soldered, and filled with silicon gel.

For an IGBT module excellent in thermal conductivity, an AlN insulating substrate-Cu base substrate is used. As solder for post-fitting of the AlN insulating substrate and the Cu base substrate, Pb-60Sn eutectic solder has been used so far.

Even if large warpage occurs to a large-sized substrate immediately after soldering, the warpage is relieved by creep peculiar to the Pb-60Sn eutectic solder, and the warpage is reduced with lapse of time. In the outermost peripheral portion of the solder, the solder structure follows deformation of the substrate and stress, and a crack does not occur easily. Therefore, there has been no problem as the life.

Meanwhile, elimination of Pb is demanded due to the environmental problem, and in Japan, Sn-3Ag-0.5Cu is used in a wide range in packaging of household appliances, communication, computers and the like.

However, the power module requires soldering of a substrate with a large area, and it is found out that with Sn-3Ag-0.5Cu which hardly causes creep deformation with respect to large deformation followed by warpage of a substrate, reduction in life remarkably occurs with respect to the thermal cycle and TFT tests. Therefore, the conventional module structure is in the situation where it has difficulty in securing reliability.

Concerning a Sn—Ag—Cu—In solder composition component, U.S. Pat. No. 5,520,752 is known.

On the other hand, in the AlN insulating substrate and Cu base substrate configuration, elongation of the life of the power cycle is the longtime problem. Namely, breaking of wire due to peeling of an Al wire bonding portion occurs, and this limits the life of the entire module.

Because of consideration to the environment, use of Pb-free solder becomes essential, and Sn-3Ag-0.5Cu solder which is generally used needs to be successfully used for a power module. The disadvantage of the Sn-3Ag-0.5Cu solder which has creep resistance but cannot perform creep deformation needs to be overcome to ensure the life.

Thus, by coating an epoxy resin (hereinafter, sometimes abbreviated simply as a resin hereinafter) with adhesion having suitable physical properties onto the periphery of a solder outermost peripheral portion which is the start point of occurrence of a crack, the breakage mechanism is changed, crack occurrence of solder is inhibited and delayed, and crack developing speed can be made low. In order to increase the life of the AlN insulating substrate and the Cu base substrate, a resin having a Young's modulus capable of restraining both of them in terms of stress and having a linear expansion coefficient close to solder, Cu, AlN and the like is coated to the end portion. Thereby, the thermal cycle life of Sn-3Ag-0.5Cu solder can be significantly increased.

The structure which covers the entire power module with an epoxy resin and secures high reliability in the temperature cycle test and the like is already shown (For example, see JP-A-2004-165281).

The problem in the structure which seals the entire power module with an epoxy resin is the problem of warpage of the module when increased in size.

Namely, in the module, warpage occurs, which is influenced by the quantitative ratio related to the thick Cu base substrate with high flexural rigidity and physical properties of the epoxy resin. First, in the warpage which occurs when the Cu-base substrate and the ceramic substrate are soldered, residual stress exists in the early stage, and the warpage relates to yield reliability of the soldering process step. In addition to this, the warpage relating to the resin physical properties and resin thickness further occurs. Each warpage needs to be suppressed in a certain range.

In this respect, in the method for coating only the solder peripheral portion with a resin, warpage does not relate to rigidity of the resin coating thickness. Therefore, the resin coated on the periphery has less influence on warpage, and this method has less problem as compared with the structure which resin-molds the entire module. On the other hand, this method increases stress load on the peripheral resin portion. The resin has the main purpose of providing the effect of direct reinforcement of solder by coating the solder portion at the outermost peripheral portion where stress concentrates remarkably. This is the structure in which solder and the resin at the peripheral portion undertake stress and strain that occur due to thermal expansion difference between the Cu base substrate and the ceramic substrate since the resin does not exist on the module central portion.

On the other hand, in order to increase the life of a power cycle, it is necessary to increase the life of the Al wire bond part. In order to increase the life of the wire bond (hereinafter, abbreviated as WB) part, it is necessary to prevent thermal fatigue of the WB part by ON-OFF action, or to delay thermal fatigue deterioration. Long-time use increases the temperature of the perimeter of the WB part little by little, and thereby, accelerates fatigue deterioration of the WB part.

Thus, the first object of the present invention is to provide a semiconductor power module with favorable reliability, which prevents acceleration of fatigue deterioration by reducing rise in temperature of the wire bond part, and significantly increases solder life.

It is found out that since Sn-3Ag-0.5 Cu solder is not capable of creep deformation though it has creep resistance, it cannot relieve occurrence of warpage of a large-sized substrate of a power module or the like by creep, and since as a result, high stress always acts on the solder, the life of the solder becomes short contrary to expectations. Therefore, the thermal cycle test with the configuration with a very low strain rate was conducted with the model equivalent to a real thing with large heat capacity, the life was evaluated in each promising Sn solder having realizability, and selection of the solder composition was performed.

A second object of the present invention is to provide a semiconductor power module designed to increase the life of the solder used between a ceramic substrate and a base substrate against the temperature change of intermittent energization and temperature cycle.

SUMMARY OF THE INVENTION

In order to attain the above described first object, a semiconductor power module of the present invention is a power module formed by connecting a base substrate of Cu or the like and a ceramic insulating substrate and a semiconductor chip with solder, and by filling a soft resin such as silicon gel, and is characterized in that an epoxy resin is coated on a perimeter of a solder end portion of the ceramic insulating substrate and the base substrate, a perimeter of an end portion of the ceramic insulating substrate at the perimeter and a part of a surface of the base substrate at the perimeter in such a manner as to wrap them.

In order to attain the above described second object, a semiconductor power module of the present invention is characterized in that for soldering of the ceramic insulating substrate and the base substrate, lead-free solder composed of Ag: 2 mass % to 4.5 mass %, Cu: 0 mass % to 2.0 mass %, In: 3 mass % to 7 mass %, and remainder of Sn is used.

Namely, the solder foil (150 μm thick) of each kind of composition considered to be promising was placed on the Cu base substrate, the $Al_2O_3$ insulating substrate having the copper-clad electrode was placed thereon, and reflow soldering was performed under the reducing atmosphere.

The model substrate in which the $Al_2O_3$ substrate 1 and the Cu base substrate 2 were bonded together shown in FIG. 1 was subjected to the thermal cycle test of −40 to 125° C., and the crack propagation rate after the lapse of the long cycle was measured by cross-section observation. As a result, in the thermal cycle test, the excellent composition is identified, and breakage mechanism is clarified, whereby the Pb-free solder composition suitable for post-fitting solder of the power module is selected.

Further, when higher reliability is required, by partially coating the epoxy resin having the proper physical properties onto the periphery of the outermost peripheral portion of the solder which is the starting point of crack occurrence, the breakage mechanism is changed, and the crack occurrence of the solder is inhibited and delayed, whereby the temperature cycle life can be remarkably increased.

According to the present invention, the power module which prevents acceleration of fatigue deterioration by reducing the temperature rise at the wire bond portion, and has favorable reliability with the solder life remarkably increased can be obtained.

According to the present invention, Pb-free solder of Sn is solder which hardly creeps, but by reforming by solid solution of In into Sn crystal, it has less brittleness and the effect of delaying crack development can be found out even in the state where the strain rate is as slow as that in the thermal cycle test. Further, the solder has the stable composition without low-temperature eutectic phase appearing even at a high temperature, the solder can withstand the longtime test at a high temperature. For various kinds of metallization, the joint interface strength as high as the strength of Sn—Ag—Cu can be expected.

Other objects, features and advantages of the invention will become apparent from the following description of the embodiments of the invention taken in conjunction with the accompanying drawings.

DETAILED DESCRIPTION OF THE INVENTION

Figure 1:
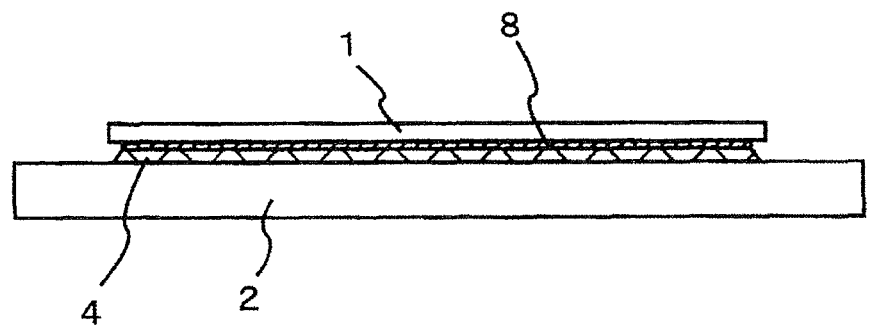
FIG. 1 is a sectional view of a test evaluation model in which an $Al_2O_3$ substrate and a Cu base substrate are joined together.

The present invention will now be described based on examples shown in the drawings.

Example 1

FIG. 1 shows a section of a test evaluation model in which each kind of rolled solder foil of 150 μm is placed between $Al_2O_3$ substrate 1 (t0.3) with Cu of 0.3 mm bonded thereon and a Cu base substrate 2 (t4) and reflowed at a soldering temperature of 245° C. at the maximum under a reducing atmosphere.

Seven kinds of solder foils that are (1) to (7) shown in Table 1, which differ in characteristics, were used, and the thermal cycle test with the module structure was conducted with respect to the promising composition. The composition was such that by including In by 5% in Sn—Ag—Cu solder, the soldering temperature was able to be lowered by about 10° C. as compared with Sn-3Ag-0.5Cu which is the basis for a post-fitting solder 4 of a low temperature, and securing of sufficient strength on the joint interface was considered.

It is known that In-adding has less adverse effect on joint strength to various kinds of metallization, mechanical characteristics of a bulk material and the like by adding a very small amount, unlike Bi-adding. Because of solid solution into the Sn crystal, reliability at a high temperature is as high as that of Sn—Ag—Cu. However, addition of a large amount of In leads to further solid solution of In into the Sn matrix, and therefore, increases internal strain and makes the solder difficult to extend. In the case of In, In is an element softer than Sn which is the base material. Therefore, it is known that increase in strength is small, reduction in extension is small, and an adverse effect on the mechanical strength by In adding is less (for example, Ninomiya; Japan Institute of Electronics Packaging, 26th seminar, 2000. 1. 26). With addition of about 5% or more of In, reduction in strength at the joint interface starts.

The rough characteristics of the tested and evaluated solder are shown below.

(1) Sn-3Ag-0.5Cu:

The typical composition of Pb-free solder, which has strength and viscosity, and has the structure in which a needle-shaped $Ag_3Sn$ develops into a network form.

(2) Sn-0.7Cu:

Sn-0.7Cu eutectic solder has a state in which $Cu_6Sn_5$ disperses in the Sn matrix, but has a smaller amount of $Cu_6Sn_5$ as compared with the amount of $Ag_3Sn$ of an Sn—Ag eutectic solder, and $Cu_6Sn_5$ does not lead to increase in strength so much as $Ag_3Sn$. Therefore, the Sn-0.7Cu eutectic solder is relatively low in strength and excellent in extension, and therefore, has the characteristic excellent in deformability.

(3) Sn-1.5Ag-0.5Cu:

The Ag amount is in the intermediate range between (1) and (2), has the structure which is not grown to such an extent that the network of $Ag_3Sn$ is formed, and has the intermediate characteristics between both of them. For the reason that it can reduce stress load to LSI as compared with the solder including 3% of Ag, it is used in solder bump connection and the like.

(4) Sn-3Ag-0.5Cu-5In:

The composition in which the typical composition of Sn-3Ag-0.5Cu is added to 5% of In, and the melting point is lowered by inclusion of In. Since In is soft, the strength at a room temperature only rises to a little higher than Sn-3Ag-0.5Cu, and extension lowers a little. However, extension (31%) at the high temperature (125° C.) increases more than Sn-3Ag-0.5Cu (20%), and therefore, it has the possibility of corresponding to creep deformation at a high temperature.

(5) Sn-0.5Cu-5In:

Since Sn—Cu crystal itself is rich in deformability, this is the composition in which the Sn—Cu eutectic which is soft and excellent in extension is added to 5% of In. This is the solder of which melting point becomes low by inclusion of In, which is excellent in extension, and low in strength. Thereby, this is the composition made by expecting the solder excellent in creep characteristics and low in stress load.

(6) Sn-1.5Ag-0.5Cu-5In:

This is the intermediate composition between (4) and (5), is in the state in which the network of $Ag_3Sn$ is not formed, is added to 5% of In, and has the melting point lowered by inclusion of In.

(7) Sn-37Pb eutectic (for comparison):

This is the solder which has been used conventionally for connecting the ceramic insulating substrates and Cu base substrates of power modules.

Table 1 is the result of measuring the crack length with respect to the entire length of the joints by cross-section observation after passage of 2500 cycles of thermal cycling −55 to 125° C., and organizing the crack development rates.

TABLE 1

| Crack propagation rate of solder | | | |
|---|---|---|---|
| No. | Solder composition | Crack propagation rate (%) | Characteristics |
| (1) | Sn—3Ag—0.5Cu | 83.4 | Needle-shaped $Ag_3Sn$ develops in network form. High strength and viscous. |
| (2) | Sn—0.7Cu | 83.1 | Low strength, and large extension. |
| (3) | Sn—1.5Ag—0.5Cu | 90.8 | Less $Ag_3Sn$. Intermediate characteristics between (1) and (2). |
| (4) | Sn—3Ag—0.5Cu—5In | 40.9 | $Ag_3Sn$ grows into network form. |
| (5) | Sn—0.7Cu—5In | 53.7 | Low in strength and excellent extension |
| (6) | Sn—1.5Ag—0.5Cu—5In | 49.1 | High strength. $Ag_3Sn$ does not develop into network form. |
| (7) | Sn—37Pb | 17.6 | Large creep |

The following new knowledge has been obtained from the result, the crack propagation situation by cross-section observation, the observation of structure change, the clarification experiment of the mechanisms and the like.

1) In; by inclusion of 5% of In, the crack propagation rate of Sn solder reduces.
2) In the Sn solder, the crack propagation rate of the solder including 3% of Ag ((1)) becomes lower than that including 0% of Ag ((2)), and that including 1.5% of Ag ((3)).
3) As compared with Sn solder, the conventional Sn-37Pb eutectic significantly reduces in crack propagation rate.

As a result, it has been found out that the composition in which In is solidly dissolved into the solder where the network of the needle-shaped $Ag_3Sn$ has been firmly developed is excellent. This is the fact which cannot be expected from the common sense.

Initially, the present inventor considered that the solder in which In was included in Sn-0.7Cu which was low in strength and excellent in extension was excellent, and the solder in which In was included in Sn-3Ag-0.5Cu which was high in strength was inferior [for example, see JP-A-2001-35978]. The above described content has repeatability in the experiment, and is the result that cannot be predicted with the common sense so far.

Thus, the present inventor studied the life increasing mechanism as follows, and has obtained the new knowledge.

1. The reason of reduction in crack propagation by In doping;

According to cross-section observation of the crack propagation, in the Sn solder without In, the crack has strong tendency to grow linearly on the same plane (seems to be sharp propagation) though sensorially. Namely, it seems to mean that the solder portion except for the crack path has less stress relaxation. By including In, In is solidly dissolved thoroughly into the entire region of the Sn matrix, and therefore, the stress state of the periphery is transmitted to the adjacent matrixes through this matrix. Further, in the stress concentration portion, microscopic crack reduction effect is expected.

As the result of relative comparison of the cross-section observation, it is considered that by inclusion of In, strength and viscousness of the original Sn solder are lost, and stress is dispersed and released in the directions other than the crack propagation direction, whereby linear propagation of the crack is delayed (seems to be the propagation lacking in sharpness).

In the impact test (Charpy), it has been confirmed that by adding the Sn solder with In, the impact absorption energy reduces. By adding about 5% of In, it reduces to as low as that of the Sn-37Pb eutectic. It is unclear whether the impact test result always directly relates to the crack propagation or not, but the damping capacity of absorbing the impact energy of the material is considered to be the phenomenon which appears as a result of solid solution of In into the Sn crystal though indirectly.

It is known that the solder added to Bi is brittle, and with addition of a very small amount, it shows extremely low impact energy at −50° C. The degree of reduction in the impact value by Bi adding seems to be extremely low and show brittleness unlike energy absorption by In. When Bi is included to enhance operability, 0.5% or less is desirable, and 1% or less at most. In this range, the problem of embrittlement hardly exists, and reliability as the power module can be secured.

As more In is included, the stress dispersing (stress relaxation) effect can be expected to be exhibited. According to the parallel state diagram, about 12% of In is solidly dissolved into Sn. With an In amount which is smaller than 12%, an eutectic phase (117° C.) at a low temperature and an In phase by a transitional change of the temperature and the like are likely to deposit with the composition close to it, and the composition cannot be said as the composition capable of withstanding the severe conditions of the power module.

When more In is solidly dissolved into an Sn solid solution, reduction in the mechanical characteristics, reduction in strength of the joint interface with metallization, and the like are brought about, and the upper limit of In is set at 7%. With 7% or less of In, the Sn solid solution is stable even at a high temperature at a level of 150° C. On the other hand, with less In, effect of dispersion of stress concentration by In decreases, and therefore, the lower limit is set at 3%. Accordingly, the proper range of In suitable for connection of the insulating substrate and the base substrate of the power cycle is 7%>In>3%.

2. The reason that the solder including sufficient Ag is superior in the solder added to In;

Since in the solder with a lot of Ag, the needle-shaped crystal of $Ag_3Sn$ is formed into a network form, and therefore, $Ag_3Sn$ which is stable at a high temperature exists as the reinforcement effect of the composite material. This effect is considered to inhibit crack propagation. As a result, in (5) Sn-0.5Cu-5In, and (6) Sn-1.5Ag-0.5Cu-5In, the crack propagation is estimated to be faster than in (4) Sn-3Ag-0.5Cu-5In with a large Ag adding amount. (6) with inclusion of 1.5% of Ag is worse than (5) with inclusion of 0% of Ag, and the crack propagation rate is the highest. Namely, it is considered that as $Ag_3Sn$ is not formed into a network form and strength is increased, crack propagation appears to be faster correspondingly than (5) with inclusion of 0% of Ag.

The upper limit of Ag adding was set at 4.5% which is in the practical range with cost or the like taken into consideration. The lower limit of Ag adding was at least 2% or more in consideration of the level without formation of the network of $Ag_3Sn$.

Accordingly, the proper range of Ag is 4.5%>Ag>2%.

3. The reason why the conventional Sn-37Pb eutectic is significantly excellent as compared with Sn solder:

In the low cycle fatigue test, it is considered to be a known fact that Sn-3Ag-0.5Cu is superior to Sn-37Pb eutectic [for example, Kariya; Nonlinear Properties of Solder Alloys and Reliability of Thermal Fatigue, Japan Institute of Electronics Packaging, Vol. 8 No. 2 (2005)]. It was studied why the Sn-37Pb eutectic solder was superior in life in the thermal cycle test of the connecting portion of the ceramic insulating substrate and the base substrate of the power module, in spite of the above fact.

The strain gauges were bonded to the ceramic insulating substrate and the surface of the Cu base substrate which sandwiched the solder of the power module, and the strain rate in the thermal cycle was measured. As a result, it was found out that the strain rate was the highest and showed 1.5 to $2 \times 10^{-6}$/s at the time of change to a low temperature from a high temperature, and was very slow.

Even the die bond portions, of which the strain rates have been regarded to be low in component joints of the communication, computer and house hold appliances so far, was regarded as in a level of $10^{-4}$/s at the lowest, though the official data was not seen.

The reason why the strain rates of the ceramic insulating substrate and the Cu base substrate of the power module are low is that the thermal capacity of the Cu base substrate and the like peculiar to the power module is large. For a rapid temperature change, the chip portion is influenced by cooling from the surface, but in the portion in the vicinity of the Cu base substrate, the strain rate hardly becomes 1.5 to $2 \times 10^{-6}$/s or higher.

Comparing the mechanical characteristics and the metallographic properties of solder at this strain rate and a strain rate lower than this strain rate, it is found out that obvious difference between Sn-3Ag-0.5Cu and Sn-37Pb eutectic appears. In the comparison of the properties and characteristics of both of them, there are many comparison data at a high strain rate of $10^{-4}$/s or higher, and it can be understood that in this range, Sn-3Ag-0.5Cu turns out to be about 1.5 times as excellent as Sn-37Pb eutectic.

Sn-37Pb eutectic solder starts to exhibit a superplasticity phenomenon (for example, M. M. I. Ahmed; Journal of Materials Science Letters 2, 1983, 59 to 62) at a low strain rate in a level of about $10^{-4}$/s or lower, and stress reduces, whereas extension abruptly increases. Namely, in the solder portion of the ceramic insulating substrate and the Cu base substrate of the power module, by the creep phenomenon peculiar to Sn-37Pb eutectic solder, the solder can adapt to the thermal cycle test of the large area joint portion followed by deformation of the module.

On the other hand, Sn solder (Sn—Ag—Cu solder is a part of it) is basically gathering of Sn crystals, and stable for temperature, but cannot creep even when the strain rate becomes low, and stress does not reduce. Namely, Sn solder is known as a solder that hardly creeps (for example, the aforesaid Kariya document).

Accordingly, Sn solder cannot relieve the warpage of the module under the same conditions in the temperature cycle test, and stress higher than that of Sn-37Pb eutectic solder always acts on the Sn solder. It is conceivable that for this reason, the Sn solder has a shorter life than Sn-37Pb eutectic solder.

Considering these phenomena, as adaptation to Pb elimination of the power module, Sn-3Ag-0.5Cu-5In was selected as the representative composition stable at a high temperature, from which increase of life cycle to some extent can be expected, in the Sn solder.

The reason why Cu is included is that the melting point can be made a little lower than Sn—Ag solder by adopting ternary eutectic of Sn—Ag—Cu. Further, there are the cases of connection to the Cu electrode on the ceramic substrate and of direct connection to the Cu base substrate, and Cu consumption by the solder is prevented. By adding Ni metallization with Cu, high strength is provided even after being left to stand at a high temperature. Further, by enhancing solid solution by Cu, enhancing precipitation of $(Cu, Ni)_6Sn_5$ or the like, and the like, solder added to Cu is strong as compared with the solder without Cu (for example, Ito, et al.; Mate 2002). The adding amount of Cu is usually 0.5 to 0.8%, and when exceeding 1%, extension reduces, but from the viewpoint of fatigue strength, 2% is set as the limit (for example, Hirata, et al.; Mate 99, p425).

The effect of In adding does not change even if the above Sn—Ag—Cu solder is added to a very small amount of Bi, Ni, Al, Ge, Zn, Sb or the like. Addition of a very small amount of each of them has the meaning of exhibiting separate characteristics of each of them.

The purpose of Ni adding is prevention of consumption of Ni by solder, and stabilization by suppressing growth of the intermetallic compound layer after being left to stand at a high temperature. The solid solution of the Ni adding amount into the solder is about 0.15%, and considering that inclusion of a large amount of Ni leads to reduction in wettability, the Ni adding amount is set as 0.2%.

The purpose of Al adding is to obtain the crack delay effect by reforming strength and ductility, and generation of very small submorphous (for example, Suzuki, et al; Mate 2004, p149). Ge adding especially has an object to prevent oxidation, and the effect can be expected in the case of connection using a foil which does not use a flux.

The purpose of Zn adding is reforming of the structure, and since Zn is a material which inhibits wettability, the Zn adding amount is set at 1% or lower.

Sb is generally used for enhancement of strength and prevention of coarsening of crystal, and the adding amount to Sn—Ag—Cu is 0.4% is preferable.

Example 2

Next, as the means for further increasing the temperature cycle life of the connection portion of the ceramic insulating substrate and the Cu base substrate, it is conceivable to coat the joint outer peripheral portion partially with an epoxy resin having proper physical properties and to reinforce it. The reason why the solder added to In is especially used is that the warpage relieving action and the like for the substrate in the soldering process can be expected, and use of the In-added solder leads to enhancement in yield of connection.

Figure 2:
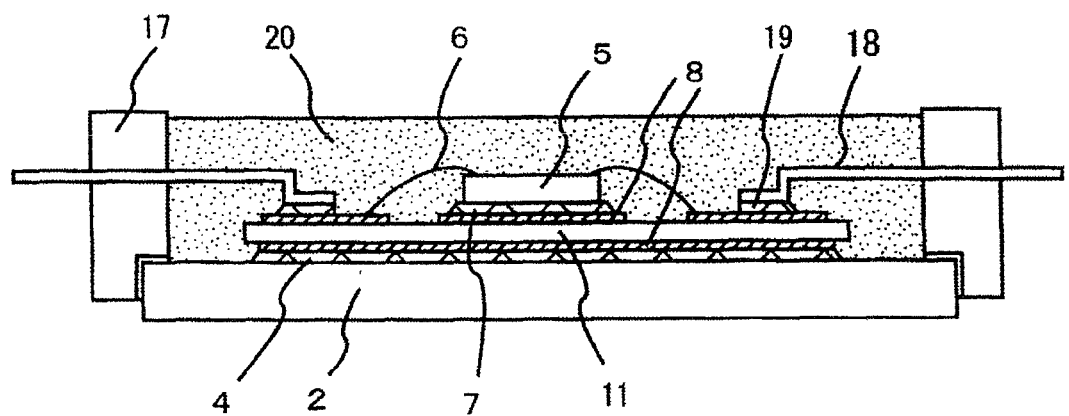
FIG. 2 is a sectional view of an example in which an end portion of an AlN insulating substrate is not partially reinforced with a resin, showing one example of a semiconductor power module of the present invention.
Figure 3:
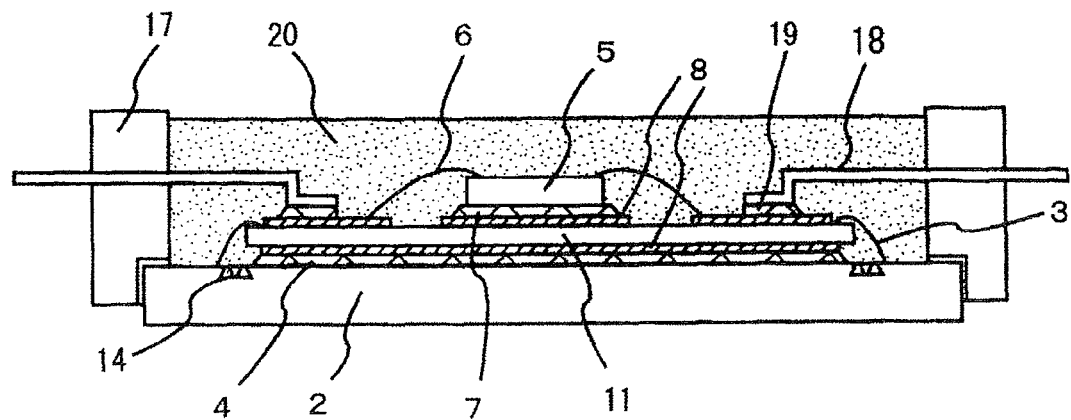
FIG. 3 is a sectional view of an example, in which a resin is coated on the end portion of the AlN insulating substrate in such a manner as to wrap it, showing one example of the semiconductor power module of the present invention.

FIG. 2 is an example in which an AlN insulating substrate end portion is not partially reinforced with a resin, and shows a sectional structure of a power module using Pb-free solder of Sn-3Ag-0.5Cu-5In. The module structure itself does not change from the conventional structure. FIG. 3 shows a structure in which an epoxy resin 3 is partially coated on the end portion of an AlN insulating substrate 11 in FIG. 2 to reinforce it.

In the configuration of the AlN insulating substrate 11-Cu base substrate 2, connection of terminals on an Si chip 5 which is in a severe condition in terms of thermal fatigue was made by an Al wire bond 6 method as the conventional one, and for soldering of the chip, a Pb-5Sn high-temperature solder 7 was used. An electrode 8 of the AlN substrate is Cu or Al (in the case of Al, Ni or Ni/Au plating is applied to the surface for ensuring wettability with the solder). An Sn-3Ag-0.5Cu-5In foil of the composition of this example is loaded between the AlN substrate to which the chip is connected with the high-temperature solder 7 and the Cu base substrate 2, and is connected to them under a reducing atmosphere. Thereafter, an Sn-3Ag-0.5Cu solder 19 in a paste or the like is supplied onto the electrode of the AlN substrate, and components, a lead wire 18 or the like are reflow-connected to it.

FIG. 3 shows the power module with the epoxy resin 3 coated onto the end portion of the AlN insulating substrate 11 in such a manner as to wrap it. After the epoxy resin 3 is cured, silicon gel 20 is filled into a plastic case 17 so as to cover the entire module. The epoxy resin 3 is desired to be coated uniformly onto the periphery of the post-fitting solder 4, and therefore, a potting resin which is an epoxy resin, easy to coat and has a low thermal expansion coefficient is used. As the coating form of the epoxy resin 3, a fillet portion is not limited to the coating structure in FIG. 3, but coating of the epoxy resin 3 onto only the portion under the substrate is also effective.

Figure 4:
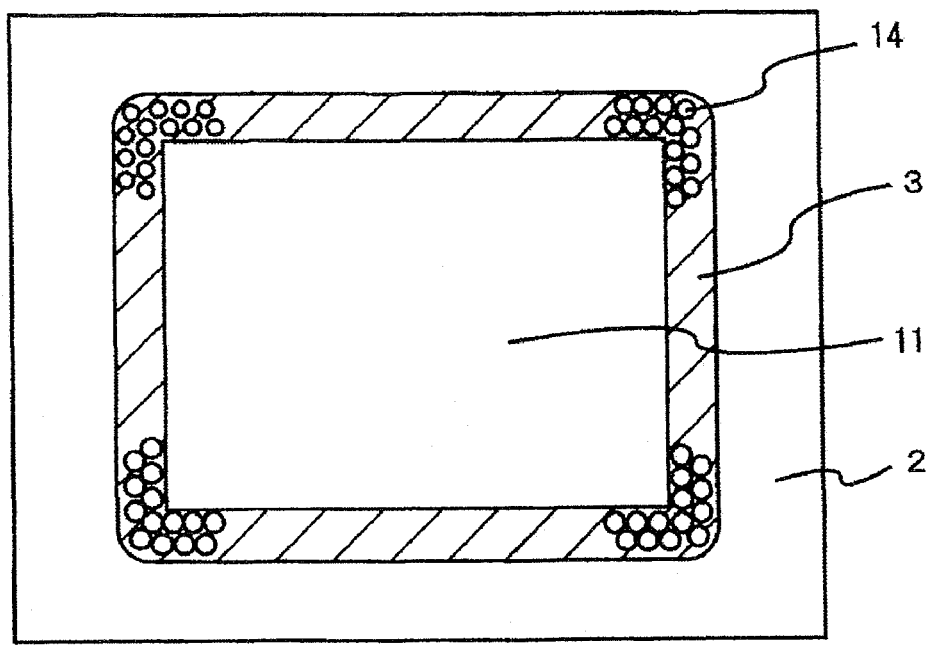
FIG. 4 is a view showing one example in which dimples are formed in the Cu base substrate.
Figure 5:
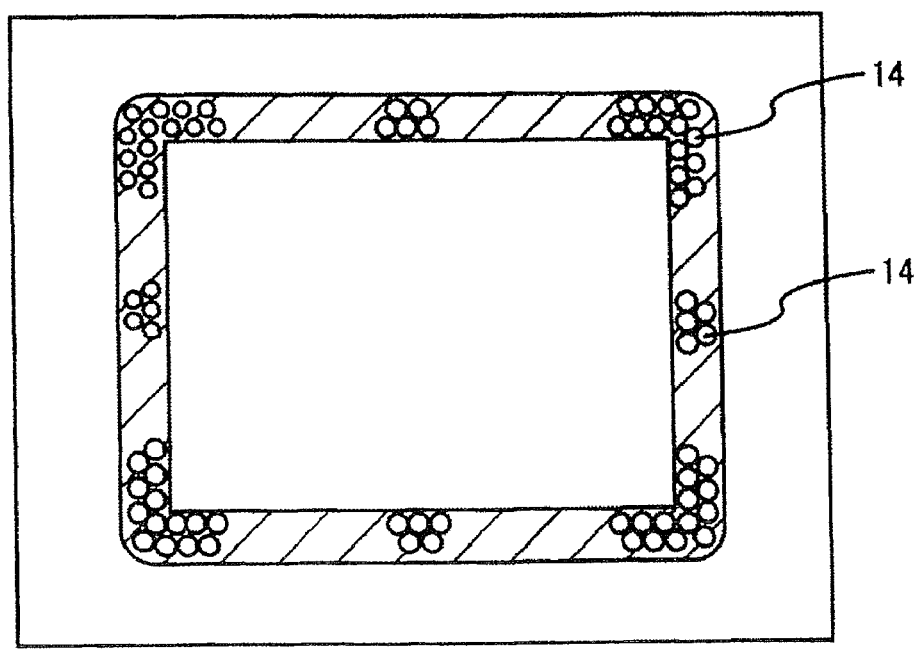
FIG. 5 is a view showing another example in which dimples are formed in the Cu base substrate.

A dimple hole 14 in the shape of an unfolded fan provided to increase adhesion between the epoxy resin 3 and the Cu base substrate 2 may be provided in the entire perimeter. Further, the dimples 14 may be provided in only the portions at four corners of the AlN insulating substrate 11 which is in a severe condition in terms of stress as shown in FIG. 4, and the dimples 14 may be provided in the portions at the four corners of the AlN insulating substrate 11 and the central portions of the sides as shown in FIG. 5.

Since the resin bears the stress load at the end portions of the periphery of the AlN insulating substrate 11, the conditions required from the resin are (a) adhesion of the resin is essential, (b) the resin should include high Young's modulus and such flexibility as to be deformable, (c) the linear expansion coefficient of the resin is close to that of Cu, and the thermal stress balance of the resin is between that of Cu ($\alpha=17.5\times10^{-6}/^\circ C.$) and AlN ($\alpha=4.3\times10^{-6}/^\circ C.$), (d) the resin is excellent in stability (high Tg: glass transition temperature) at a high temperature, and the like.

The resin physical properties are preferably in the range of the Young's modulus; 300 to 3000 kgf/mm$^2$, and the linear expansion coefficient; 6 to $25\times10^{-6}/^\circ$ C.

Example 3

It has been found out that as long as Pb-free Sn solder is used, the power module cannot withstand the thermal cycle and TFT of the long-time reliability test with only the solder against the thermal fatigue deterioration of the solder between the AlN insulating substrate and the Cu base substrate.

Figure 6:
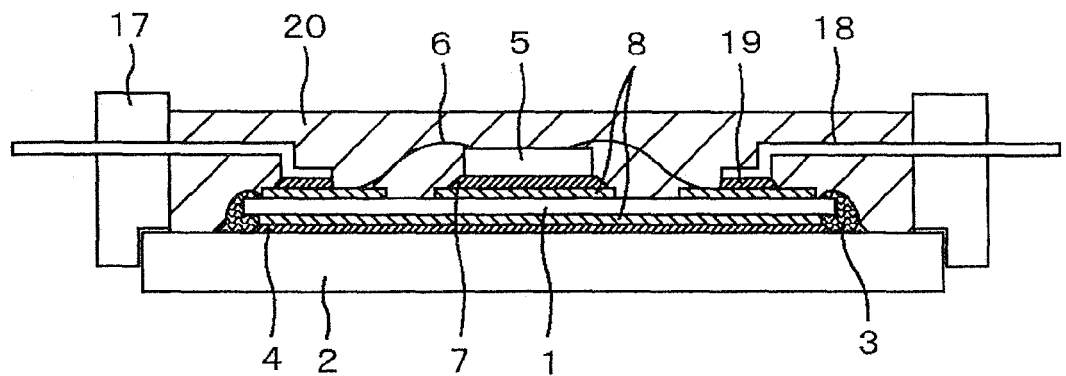
FIG. 6 is a sectional view of the semiconductor power module according to a first embodiment of the present invention.

FIG. 6 shows an example of the form of coating and covering the resin 3 onto the periphery of the solder portion 4 of the AlN insulating substrate 1 and the Cu base substrate 2, which is in the severe condition in terms of thermal fatigue and from which remarkable effect of improvement in enhancement in reliability by a resin can be expected, in the configuration formed by the AlN insulating substrate and the Cu base substrate 2.

As shown in the drawing, the electrode lead from the chip 5 adopts the wire bond 6 method of the Al wire as in the conventional power module, and is further connected to an external connection terminal lead 18 with a post-fitting solder 19. For soldering of the chip 5, high-melting point temperature solder 7 of Pb-5Sn was used. The electrode 8 of the AlN insulating substrate 1 is formed of Cu or Al (in the case of Al, Ni or Ni/Au plating is applied to the surface for wettability with the solder. Plating may be applied to only the solder portion).

Since the resin 3 is desired to be coated on the periphery of the solder portions 4 as uniformly as possible, a resin for potting which is epoxy and easily coated with a low thermal expansion coefficient is used. The resin 3 is desired to be coated so that a resin fillet is formed in the periphery of the solder portion 4.

The resin physical properties are preferably in the range of the Young's modulus; 300 to 3000 kgf/mm$^2$, and the linear expansion coefficient; 6 to 25×10$^{-6}$/° C. As the Young's modulus of the resin 3, the Young's modulus of a 300 kgf/mm$^2$ or more which can restrain the periphery in terms of stress is required, and the maximum value is considered to be about 3000 kgf/mm$^2$. If the Young's modulus is too high, too much filler is included. Therefore, the resin has no deformability for the warpage of the substrate and has the possibility of breaking a brittle ceramic substrate.

As the desirable resin physical property, the linear expansion coefficient is between the AlN insulating substrate 1 and the Cu base substrate 2, or is close to the Cu base substrate 2. The reason of matching the linear expansion coefficient with the linear expansion coefficient between those of the AlN insulating substrate 1 and the Cu base substrate 2 is that the resin makes mechanical balance favorable and reduces thermal stress which is generated, but a large amount of filler is included due to the characteristics of the resin, and flowability becomes worse and operability become low. Since the Young's modulus becomes high, the resin is not suitable for the structure with large warpage, and is suitable for a small-sized structure with less warpage. The reason why the linear expansion coefficient is matched with the one close to the base substrate of Cu, Al and the like is that the resin is a resin of which linear expansion coefficient is made high, and therefore, the flowability of the resin increases since it requires only a small amount of filler, and is also excellent in operability. Since the resin is excellent in flexibility, it is easily adapted to the substrate with large warpage. After the resin 3 is cured, the inside of the case 17 is filled with the silicon gel 20.

Figure 7A:
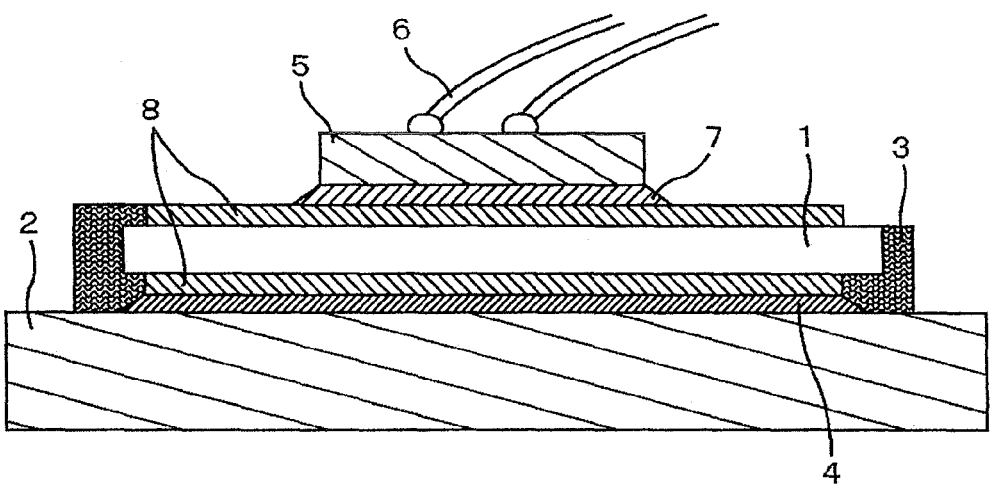
FIGS. 7(*a*) and 7(*b*) are both sectional views of the semiconductor power module showing a modified example of the first embodiment of the present invention.
Figure 7B:
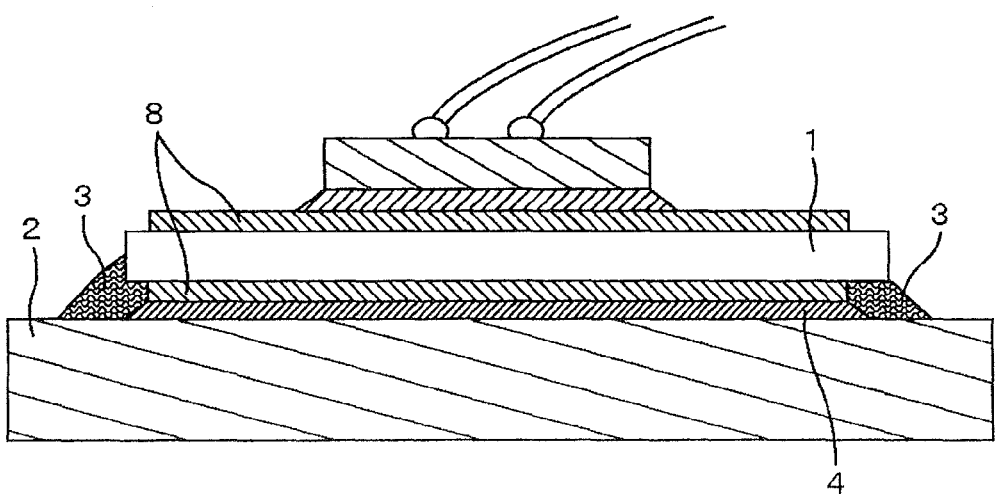

FIGS. 7(a) and 7(b) show the forms of resin coating onto the periphery of the AlN insulating substrate 1, the form of the left side of FIG. 7A is coating of the resin 3 in such a manner as to wrap the end portion of the AlN insulating substrate 1. The forms or the like shown at the right side of FIG. 7A and at the left and right of FIG. 7(b) are also effective.

Since the resin 3 bears the stress load in the end portion of the periphery of the AlN insulating substrate 1, the conditions required from the resin 3 are that 1) the resin has high adhesion, 2) the resin includes a high Young's modulus and such flexibility as to be deformable, 3) the resin is close to Cu in the linear expansion coefficient, and is between Cu ($\alpha$=17.5×10$^{-6}$/° C.) and AlN ($\alpha$=4.3×10$^{-6}$/° C.) in the thermal stress balance, 4) the resin is excellent in stability (high Tg: glass transition temperature) at a high temperature, and the like.

Example 4

Correspondence of the Sn solder between the AlN insulating substrate 1 and the Cu base substrate 2 by the temperature cycle test and the TFT test was shown in Example 3.

There has been the experience of making the marginal design with reliability ensured, in the structure before elimination of Pb so far, and it cannot be said to be in the sufficiently satisfactory state. We are now in the circumstances where longer life is expected from the products from which high reliability is expected. The factor which determines the life of the power cycle is not the life of the Pb-5Sn high-temperature solder which connects the chip 5 and the AlN insulating substrate 1, but the fatigue failure life of the wire bond portion (WB).

Figure 8:
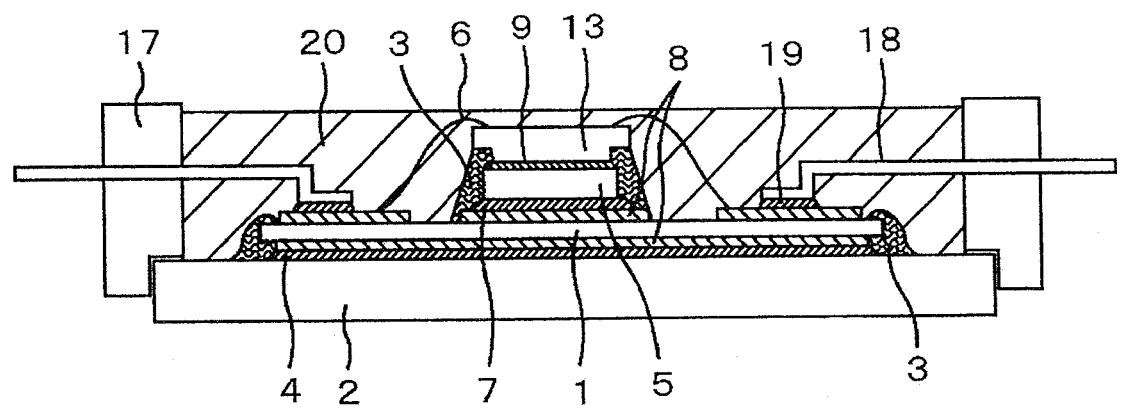
FIG. 8 is a sectional view of a semiconductor power module according to a second embodiment of the present invention.

Thus, as the structure which achieves high reliability by using the WB method of the present technique, a Cu plate 13 which is a highly thermal conductive metal plate is soldered to the top surface of the chip 5 so that an electrode is obtained from the surface of the Cu plate 13. The undersurface of the Cu plate 13, the perimeter of the chip 5, the perimeter of the solder portion 4, the top of the AlN insulating substrate 1 of the perimeter and the top of the electrode 8 on the AlN insulating substrate 1 are covered with the resin 3, and are independently reinforced with the resin 3 respectively and partially as shown in FIG. 8, and thereby, increase in life cycle in all the reliability tests that are the power cycle test, the TFT test and the thermal cycle test is aimed at.

Figure 9A:
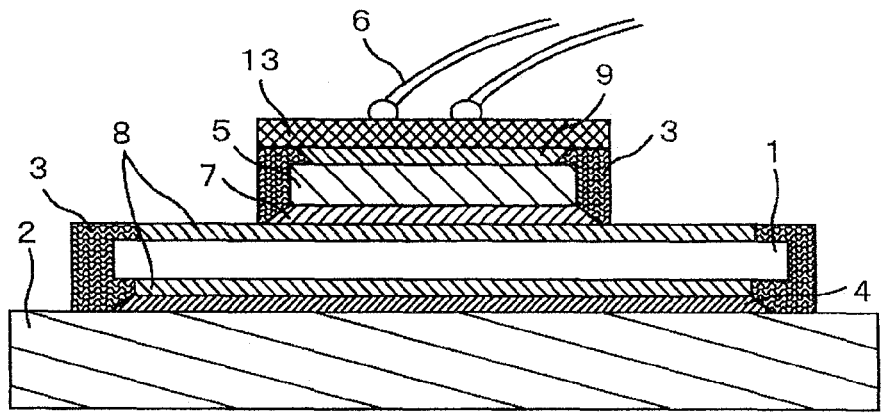
FIGS. 9(*a*), 9(*b*) and 9(*c*) are all sectional views of the semiconductor power module showing a modified example of the second embodiment of the present invention.
Figure 9B:
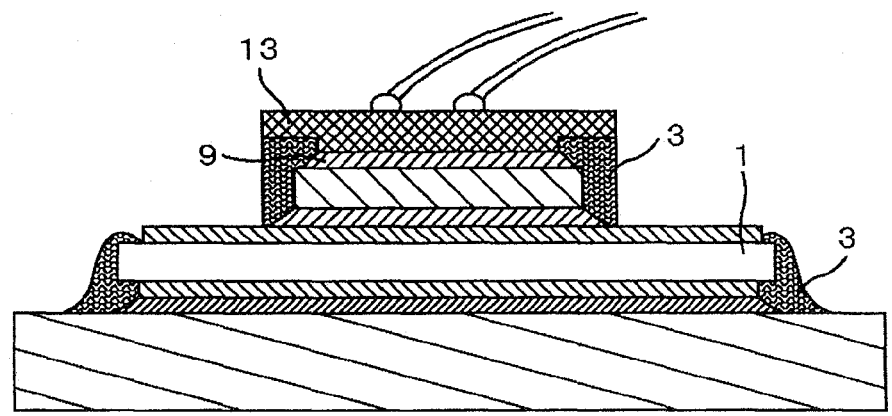
Figure 9C:
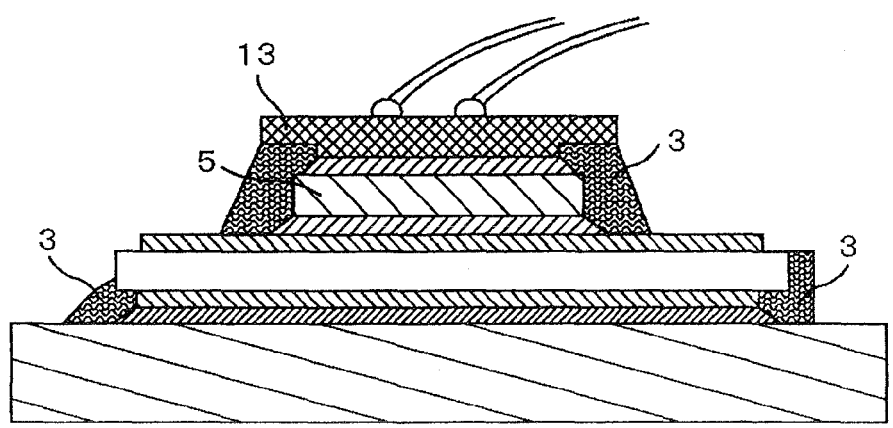

FIGS. 9(a) to 9(c) show three example models in which the resin coating form examples of the peripheries of the chips 5 and the peripheries of the AlN insulating substrates 1 differ. FIGS. 9A and 9B are examples in which the coating forms at the side of the AlN insulating substrate 1 are changed. In FIG. 9B, the Cu plate 13 on the chip 5 is changed into a hat shape to be excellent in heat dissipation capacity, and strain exerted on the solder portion 4 between the chip 5 and the Cu plate 13 is made small to enhance the adhesion with the resin 3.

The disadvantage of use of the Cu plate 13 on the chip 5 is that the life of the solder portion 4 between the chip 5 and the Cu plate 13 is short, but by adopting the structure of partial reinforcement with the resin 3, the life is increased as compared with the conventional structure in the thermal cycle and TFT, and therefore, this method holds good. FIG. 9C shows the example in which the side of the chip 5 is changed, and two kinds of fillet shapes are formed at the side of the AlN insulating substrate 1.

By newly soldering the Cu plate 13 onto the chip 5, and by taking the wire bond from the top of the Cu plate 13, the heat dissipating effect by the heat dissipation of the Cu plate 13 excellent in heat conductivity is provided. So far, when the life of the power cycle was near its end, the temperature rise in the WB part increased to shorten the life.

The temperature rise in the WB part is relieved by this structure, and the life can be elongated correspondingly. The effect of increase of the solder life can be also expected by partially coating the perimeter of the solder portion 4 between the chip 5 and the AlN insulating substrate 1 directly without providing the Cu plate 13.

Example 5

Figure 10A:
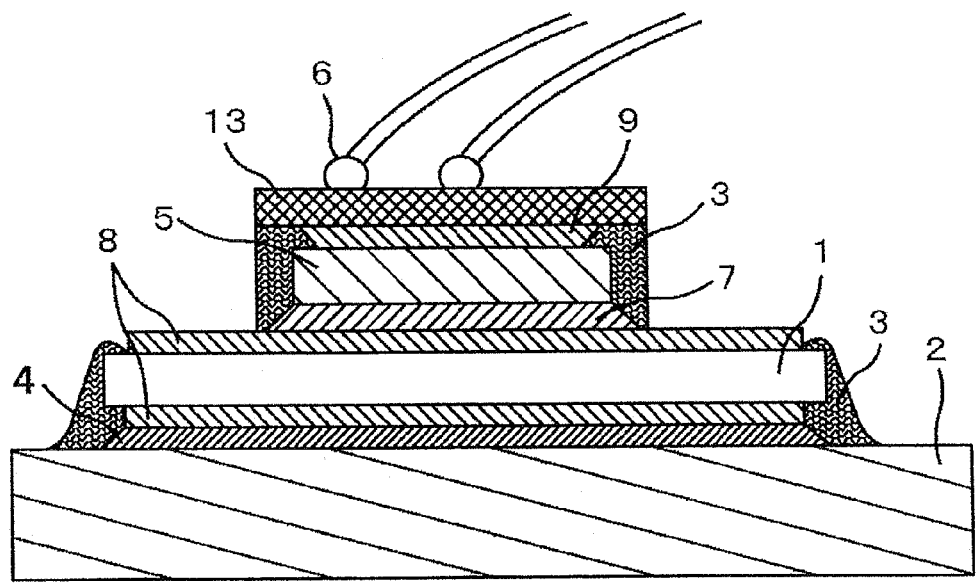
FIG. 10(*a*) is a sectional view of a semiconductor power module according to a third embodiment of the present invention, FIG. 10(*b*) is a sectional view and a plane view showing one example of the chip portion, and FIG. 10(*c*) is a sectional view and a plane view showing another example of the chip portion.

FIG. 10A shows a structure showing one example of the soldering process. The example shown in the drawing is the example of performing soldering by positioning and fixing a Pb-5Sn high temperature solder 7 foil (melting point; 310 to 314° C.) on the AlN insulating substrate 1, the Si chip 5 thereon, a Pb-5Sn high temperature solder 9 foil thereon, and the Cu plate 13 further thereon by using a carbon jig and the like and by passing them through the reflow furnace.

Further, an Sn solder (for example, Sn-3Ag-0.5Cu (melting point; 217 to 221° C.)) foil is placed between the AlN insulating substrate 1 loaded with the chip 5 and the Cu base substrate 2, and soldering is performed in the reflow furnace at 245° C. at the maximum. The maximum soldering temperature is not limited, but is determined by considering heat resistance, wettability, fuse separability and the like of the components.

By soldering under the reducing atmosphere, the cleaning process step of the flux is not required, and therefore, wire bond 6 and coating of the resin 3 can be performed immediately after soldering.

The method for cleaning by using solder paste or the like or the method without cleaning can be adopted. After wire bond, an epoxy resin having proper physical properties is coated onto the side surface of the perimeter of the chip 5, the solder portion 7, a part of the surface of the AlN insulating substrate 1, the perimeter of the AlN insulating substrate 1, the solder portion 4, and a part of the surface of the Cu base substrate 2, and thereafter, is cured. The method for performing wire bond after curing the resin can be adopted.

The Cu plate 13 on the chip 5 may be divided into two or more for the reason of taking the electrode of the chip 5, and may be integrated with the resin 3.

Figure 10B:
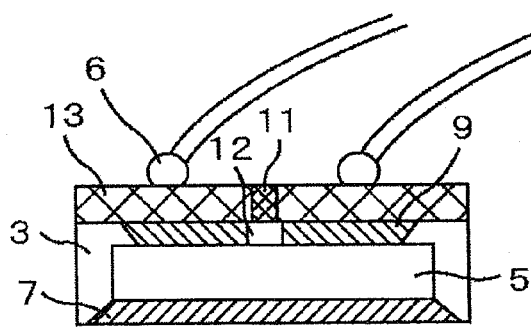
Figure 10C:
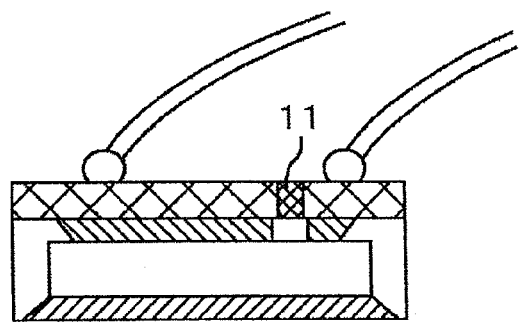
Figure 10C:
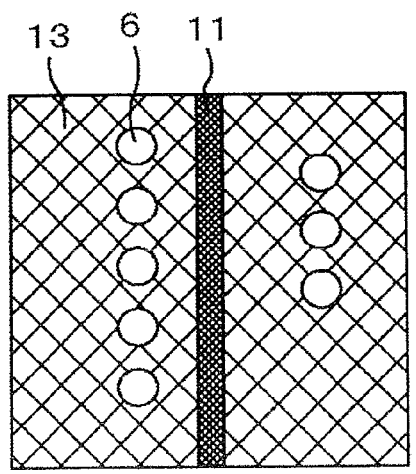
Figure 10C:
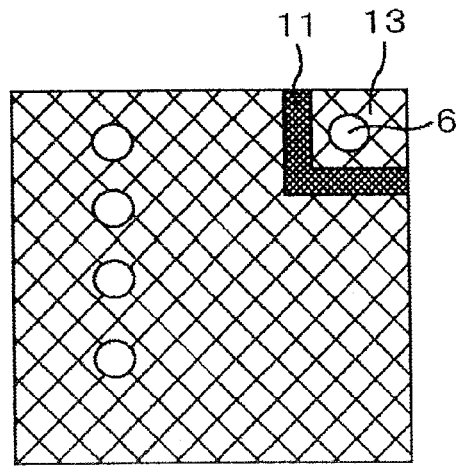

FIGS. 10(b) and 10(c) show examples each using Cu in a plate shape which is formed by bonding a block shaped Cu divided into two in advance together with an insulation resin 11 with a gap ensuring insulation therebetween, and by cutting it crosswise to a fixed thickness into a plate shape. Solder can be provided by the method for supplying it in the separated state to between the two electrodes, or by the method for supplying it by one foil and preventing short circuiting between the adjacent electrodes by fuse separation. A space 12 exists under the insulation resin 11 bonding the Cu plate 13 immediately after soldering, but thereafter, the resin sometimes enters the space 12 when the perimeter of the chip 5 is coated with the resin, or the space is vacant as it is in some case. After wire-bonding the Al wires on the Ni plating on the Cu plate 13, the module surface is filled with silicon gel.

Example 6

Figure 11A:
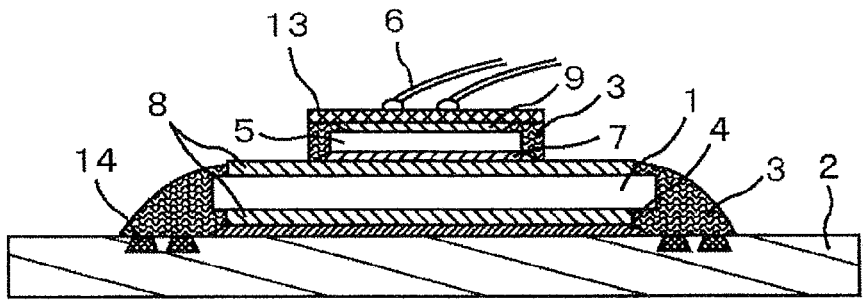
FIG. 11(*a*) is a sectional view of a semiconductor power module according to a fourth embodiment of the present invention, FIG. 11(*b*) is a plane view of the same, and FIGS. 11(*c*) and 11(*d*) are sectional views showing examples of the Cu base substrate respectively.

FIG. 11(a) shows a sectional model of a structure in which an epoxy resin is coated on the perimeter of the chip 5 and the perimeter of the AlN insulating substrate 1.

In the outer peripheral portion of the AlN insulating substrate 1 on which large stress dimensionally acts, the measure to enhance adhesion of the Cu base substrate 2 plated with Ni which has the problem in adhesiveness and the resin 3 is required.

From the necessity of securing adhesion with the Cu base substrate 2, a coupling agent or the like is put into the resin 3, but this is not almighty.

Figure 11B:
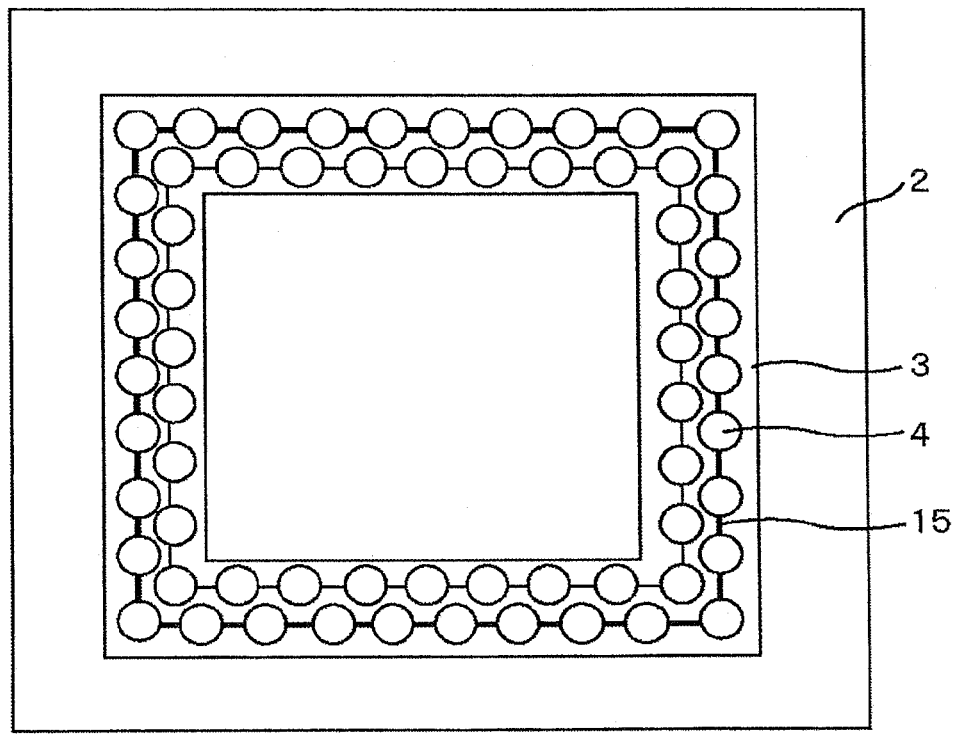
Figure 11C:
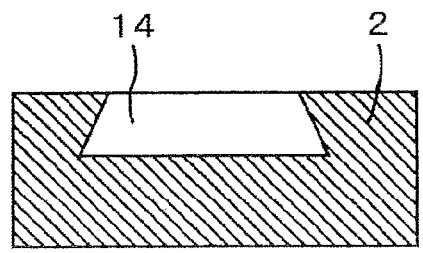

Thus, by providing a number of splay holes 14 shown FIG. 11(c) in the perimeter of the solder portion 4 on the Cu base substrate 2, separation on the bonding interface can be prevented in the thermal cycle and TFT tests. Thereby, when strong stress acts on the surface of the Cu base substrate 2, breakage can be caused in the internal portion of the resin instead of the interface. Accordingly, breakage with a number of strength variations caused by the substrate surface state can be prevented, and the breaking strength close to the stable resin bulk can be secured.

Figure 11D:
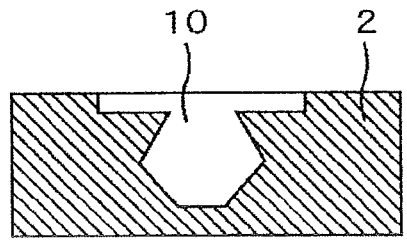

The fine grooves 15 of FIG. 11(b), splay holes (dimples) 14 of FIG. 11(c), and complicated shaped holes including splay portions 10 of FIG. 11(d) can be formed by the two-stage pressing work (for example, see JP-A-7-273270). The dimples may be formed to be overlaid on one another, and if they are overlaid on one another, the fine grooves 15 are not necessary. Dimple work is not limited to the Cu base substrate 2, and the similar effect can be expected from the Al, Cu—C, Al—C, and Al—SiC base substrates.

The effect of the resin can remarkably increase the life by suppressing strain acting on the solder by restraining the AlN insulating substrate 1 in terms of stress in accordance with Young's modulus and the linear expansion coefficient of the region 3.

Therefore, stronger adhesion of the resin 3 to the Cu base substrate 2 is better. Especially in the case of the AlN insulating substrate 1, the difference in linear expansion coefficient from the Cu base substrate 2 is large. Therefore, in the thermal cycle test and the like, the life of the module depends on the solder life of the joint portion. Therefore, in this structure, the significance of remarkably increasing the life of the solder by partially covering and reinforcing the perimeter of the AlN insulating substrate 1 with a resin having proper physical properties is great.

Figure 12A:
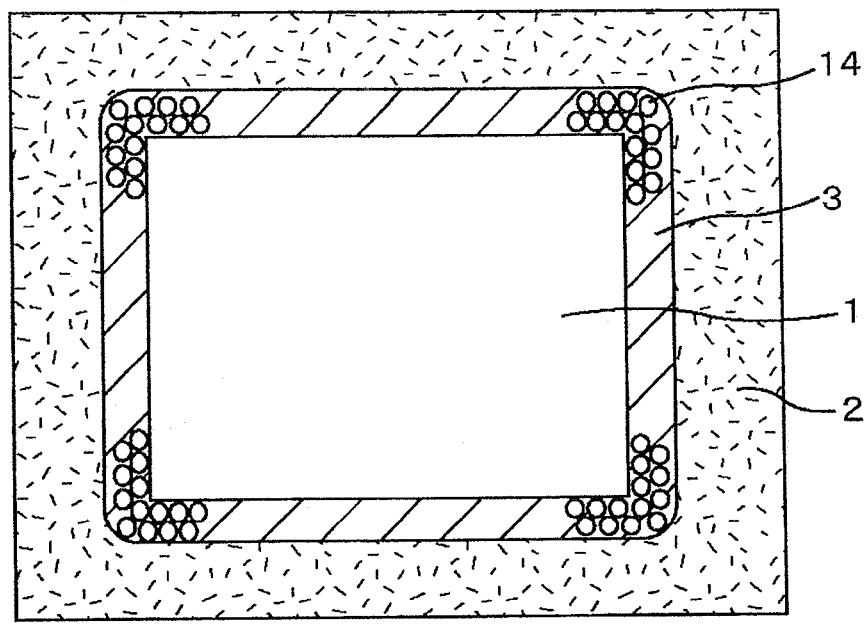
FIGS. 12(*a*) and 12(*b*) are both plane views of the semiconductor power module showing modified examples of the fourth embodiment of the present invention.
Figure 12B:
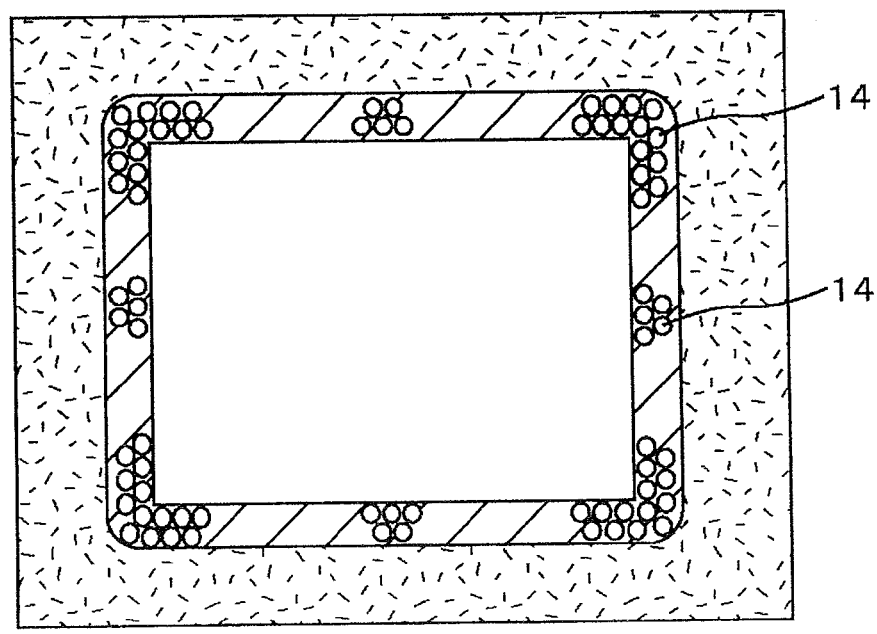

Examples shown in FIGS. 12(a) and 12(b) are the examples in which an epoxy resin is partially coated on the four corner portions where stress easily concentrates, or the four corner portions and the intermediate portions of the four sides and the like instead of the entire periphery of the solder end portion of the AlN insulating substrate 1 and the Cu base substrate 2, and this is also effective. Further, by applying the dimple groove work to the surface of the coated Cu base substrate 2, stress reinforcement by the resin can be promoted. FIG. 12(a) shows an example in which the groove work is applied to the four corner portions, whereas FIG. 12(b) shows the example in which groove work is provided in the four corner portions and the intermediate portions of the four sides.

Example 7

An $Al_2O_3$ substrate and a Cu base substrate were soldered with Sn-3Ag-0.5Cu, and the thermal cycle test at −40 to 125° C. was conducted in the structure as it is without a resin, and the structure in which the resin is partially coated on the perimeter of the solder portion.

As a result, the partially resin coated structure showed significant increase in life. Further, in the two-dimensional finite element method analysis with solder set as elastoplasticity, when comparing the maximum equivalent strain of the outermost peripheral solder, it has been confirmed that the maximum equivalent strain of the partially resin coated structure reduces significantly as compared with the structure without a resin, and it has been confirmed that correspondence with the actual life can be obtained.

Next, as a result of evaluating the structure in which the resin is partially coated on only the solder perimeter under the chip and the structure without a resin, with respect to the Pb-5Sn high-temperature solder portion perimeter under the Si chip, high reliability of the partially resin coated structure can be similarly confirmed.

Further, it can be confirmed that in the structure in which the chip side is in the Cu hat shape shown in FIG. 11(a), and the resin is partially coated, the life is long as compared with the structure without a resin.

In this case, selection of the Cu hat shape and size on the chip is important. In the resin partially coated structure, the value of the maximum equivalent strain of the solder is relatively large, but the life is long. Therefore, it is considered that by relaxation of stress concentration by the resin, and change in the breakage mechanism, the restraining force of the resin in the crack starting point exerts influence on delay of crack occurrence and delay of crack development speed.

Various kinds of examples are described thus far, and in adaptation to Pb elimination, use of Sn solder is essential as the post-fitting solder of the power module, but it is difficult to achieve high reliability with only a solder material.

Thus, as in the examples, by partially reinforcing the outer peripheral portion of the solder with the resin, the life can be increased with the resin amount reduced. The effect of partial resin reinforcement in the post-fitting solder portion in the structure in the severe state in terms of stress is especially exhibited remarkably. When the solder portion at the chip side is partially reinforced with a resin, the effect of the resin is exhibited more in the material constitution more difficult in terms of stress. Further, in the solder portion at the chip side, the Cu hat is provided on the chip, wire bond is obtained from the top of it, and the perimeter of the solder portion is partially reinforced with the resin, whereby, there is provided the effect leading to not only increase of the temperature cycle and TFT life of the chip side solder but also leading to the increase of the life of the power cycle which is the problem of the wire bond method.

It should be further understood by those skilled in the art that although the foregoing description has been made on embodiments of the invention, the invention is not limited thereto and various changes and modifications may be made without departing from the spirit of the invention and the scope of the appended claims.

What we claim is:

1. A semiconductor power module formed by connecting a base substrate and a ceramic insulating substrate and a semiconductor chip to one another with solder,
   wherein for soldering of the ceramic insulating substrate and the base substrate, lead-free solder comprised of Ag: 2 mass % to 4.5 mass %, Cu: 0 mass % to 2.0 mass %, In: 3 mass % to 7 mass %, and remainder of Sn is used.

2. The semiconductor power module according to claim 1, wherein in the lead-free solder, at least one kind of Bi, Zn, Ge, Al, Ni and Sb is included.

3. The semiconductor power module according to claim 2, wherein gel filler is filled into the semiconductor power module to cover portions of the said base substrate, said ceramic insulating substrate and said semiconductor chip, and epoxy resin is at least partially coated on a perimeter of an end portion of the solder connecting the ceramic insulating substrate and the base substrate, a perimeter of the ceramic insulating substrate and a part of a surface of the base substrate in such a manner as to wrap them.

4. The semiconductor power module according to claim 3, wherein the gel filler comprises silicon gel.

5. The semiconductor power module according to claim 2, wherein dimple groove work is applied to a part of the base substrate and an epoxy resin is coated on the part of the surface of the base substrate in such a manner as to wrap the dimple groove work.

6. The semiconductor power module according to claim 1, wherein gel filler is filled into the semiconductor power module to cover portions of the said base substrate, said ceramic insulating substrate and said semiconductor chip, and epoxy resin is at least partially coated on a perimeter of an end portion of the solder connecting the ceramic insulating substrate and the base substrate, a perimeter of the ceramic insulating substrate and a part of a surface of the base substrate in such a manner as to wrap them.

7. The semiconductor power module according to claim 6, wherein the gel filler comprises silicon gel.

8. The semiconductor power module according to claim 1, wherein dimple groove work is applied to a part of the base substrate and an epoxy resin is coated on the part of the surface of the base substrate in such a manner as to wrap the dimple groove work.

9. The semiconductor power module according to claim 1, wherein the base substrate is made of a metal-containing material.

10. The semiconductor power module according to claim 1, wherein the base substrate is made of a copper-containing material.

11. The semiconductor power module according to claim 1, wherein in said lead-free solder, the In is dissolved therein.

12. The semiconductor power module according to claim 1, wherein the lead-free solder is a network of needle-shaped $Ag_3Sn$, and the In is dissolved in the solder.

13. The semiconductor power module according to claim 1, wherein the lead-free solder includes 0.5 to 0.8 mass % Cu.

* * * * *